(12) United States Patent
Philips

(10) Patent No.: US 7,626,526 B2
(45) Date of Patent: Dec. 1, 2009

(54) SIGNAL PROCESSING CIRCUIT COMPRISING A SIGMA DELTA ANALOG TO DIGITAL CONVERTER

(75) Inventor: Kathleen Philips, Retie (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/092,864

(22) PCT Filed: Nov. 7, 2006

(86) PCT No.: PCT/IB2006/054150

§ 371 (c)(1),
(2), (4) Date: Oct. 24, 2008

(87) PCT Pub. No.: WO2007/054895

PCT Pub. Date: May 18, 2007

(65) Prior Publication Data

US 2009/0153382 A1    Jun. 18, 2009

(30) Foreign Application Priority Data

Nov. 11, 2005    (EP)    ................................. 05110661

(51) Int. Cl.
*H03M 3/00*    (2006.01)
(52) U.S. Cl. ...................................... 341/143; 341/155
(58) Field of Classification Search .......... 341/143–170
See application file for complete search history.

(56) References Cited

U.S. PATENT DOCUMENTS

| 5,986,598 | A  | * | 11/1999 | Mittel | ........................ 341/143 |
| 6,127,955 | A  | * | 10/2000 | Handel et al. | ............... 341/120 |
| 6,414,615 | B1 | * | 7/2002  | Cheng  | ........................ 341/143 |
| 6,445,317 | B2 | * | 9/2002  | Lundin et al. | ............... 341/120 |
| 6,670,901 | B2 | * | 12/2003 | Brueske et al. | ............. 341/139 |
| 6,693,572 | B1 |   | 2/2004  | Oliaei et al. | |
| 6,864,817 | B1 |   | 3/2005  | Salvi et al. | |

OTHER PUBLICATIONS

Nielsen, Jannik Hammel; et al "A Low-Power 10-Bit Continuous-Time CMOS Sigma-Delta A/D Converter" Proceedings of the International Symposium on Circuits and Systems, 2004. ISCAS '04. May 2004, vol. 1, pp. I-417-I-420.

* cited by examiner

*Primary Examiner*—Lam T Mai

(57) ABSTRACT

A signal processing circuit comprising a sigma delta analog to digital converter with a feedback loop that comprises an analog filtering circuit (14) that has a controllable time constant. In a calibration mode, a detector (18) detects a signal strength in a band (34) of frequencies at an output of the sigma delta analog to digital converter. A bandwidth control circuit (19) has an output coupled to a control input of the analog filtering circuit (14), and is arranged to control said time constant dependent on a signal strength in a band (34) of frequencies at the output of the sigma delta analog to digital converter. The band (34) of frequencies is selected so that noise shaped quantization noise density (32) of the sigma delta analog to digital converter rises with frequency.

6 Claims, 4 Drawing Sheets

SIGNAL PROCESSING CIRCUIT COMPRISING A SIGMA DELTA ANALOG TO DIGITAL CONVERTER

The invention relates to a circuit that comprises a sigma delta analog to digital conversion circuit.

Sigma delta analog to digital conversion circuits are well known. A sigma delta analog to digital conversion circuit is known for example from an article titled "A low-power 10-bit continuous-time CMOS sigma-delta A/D converter, by Jannik Hammel Nielsen and Erik Braun and published in ISCAS 2004 page 1-417 to 1-420. Furthermore, general background on sigma delta A/D conversion circuits can be found for example in the book titled "Delta Sigma data conversion", S. Norsworthy, ISBN 0-7803-1045-4, on pages 174-182.

A simple sigma-delta A/D converter comprises a digitizer circuit with an integrating feedback loop from its output to its input. The digitizer circuit digitizes a signal resulting from a difference between a signal derived from an input signal and an integration of the output signal of the digitizer circuit.

The advantage of sigma delta A/D conversion is that quantization noise (difference between corresponding versions of the input signal and the output signal) is shifted mainly to a high frequency band. This is commonly called noise shaping. Thus, the low frequency part of quantization noise is relatively small, even if very coarse quantization is used, because the feedback counteracts the low frequency differences. More generally, the loop of the sigma-delta A/D comprises a frequency dependent filtering circuit, which counteracts the differences in a frequency band of interest (the low frequency band in the case when an integrating filter circuit is used). This filtering circuit can be in a forward and/or in the feedback part of the loop. Thus, quantization noise is restricted to frequency bands where it is not harmful.

The construction of the filtering circuit that is used in the loop (i.e. in the feedback or the forward path) of the sigma delta A/D converter is an important design aspect of such a converter. This filter presents a manufacturing problem, especially when the sigma-delta A/D converter is integrated in an integrated circuit, because it is difficult to control the spread in the impedance of the circuit elements in the filtering circuit. It is known to address this problem by using circuit elements of only one type (e.g. only capacitances), because in that case spread does not affect the ratio between the impedances of these circuit elements. However, an all-capacitance filtering circuit can only be realized by means of switched capacitance techniques (that is, by means of discrete time techniques).

It would be desirable to have a time-continuous filtering circuit. In this case analog circuit elements of mutually different types must be used, such as (gate) capacitances and (channel) conductance (or channel resistances) in such a filtering circuit. The article by Nielsen and Braun describes a sigma-delta A/D converter that uses integrators formed by capacitances and resistances of FET channels.

However, in when such different analog circuit elements such as capacitances and resistances are used, the effects of manufacturing spread cannot be avoided. As a result, it is difficult to control the bandwidth of the filtering circuit and thereby the entire operation of the sigma-delta A/D converter.

Among others, it is an object of the invention to provide for a circuit with a sigma-delta A/D converter wherein a time constant of the filtering circuit can be regulated.

A signal processing circuit according to claim 1 is provided with a sigma delta analog to digital converter. Herein a detector is used to detect signal strength in a band of frequencies wherein signal strength noise shaped quantization noise density of the sigma delta analog to digital converter rises with frequency. The detected signal strength is used to control a time constant of the filtering circuit in the feedback loop (in the feedback part and/or the feed forward part of that loop) of the sigma delta analog to digital converter. The time constant is adapted to realize a desired signal strength that is characteristic of the desired value of the time constant. Thus calibration of the filtering circuit is realized. Preferably, this is applied to a time continuous filtering circuit. In this case this form of calibration overcomes the problems due to manufacturing spread, but of course this form of calibration can also be used in different types of sigma delta analog to digital converters. In a further embodiment the analog filtering circuit comprises a capacitance coupled to a time-continuous conductance or transconductance circuit, a ratio of capacitance and conductance or transconductance values, of the capacitance and the conductance or transconductance circuit respectively, being at least partly determinative of the time constant, the bandwidth control circuit controlling said ratio dependent on said signal strength. This provides a practical way of adapting the time constant in a time continuous filter circuit.

In an embodiment the bandwidth control circuit supports switching between a normal operating mode and a calibration mode. Preferably a band filter circuit is used in front of the detector that supplies useful signal to other circuits in the normal operating mode. In this case filter band is preferably switched to the calibration band of frequencies when switching to the calibration mode. Typically, there is no overlap between the calibration band and the normal operating band of the band filter, or only a minority band part of overlap. In a further embodiment a calibration signal source is used to provide signals to the input of the sigma delta analog to digital converter in the calibration mode. Alternatively, normal operating signals may be used, but this may make reliable calibration more difficult.

These and other objects and advantages of the invention will be described using exemplary embodiments, by reference to the following figures.

Figure 1:
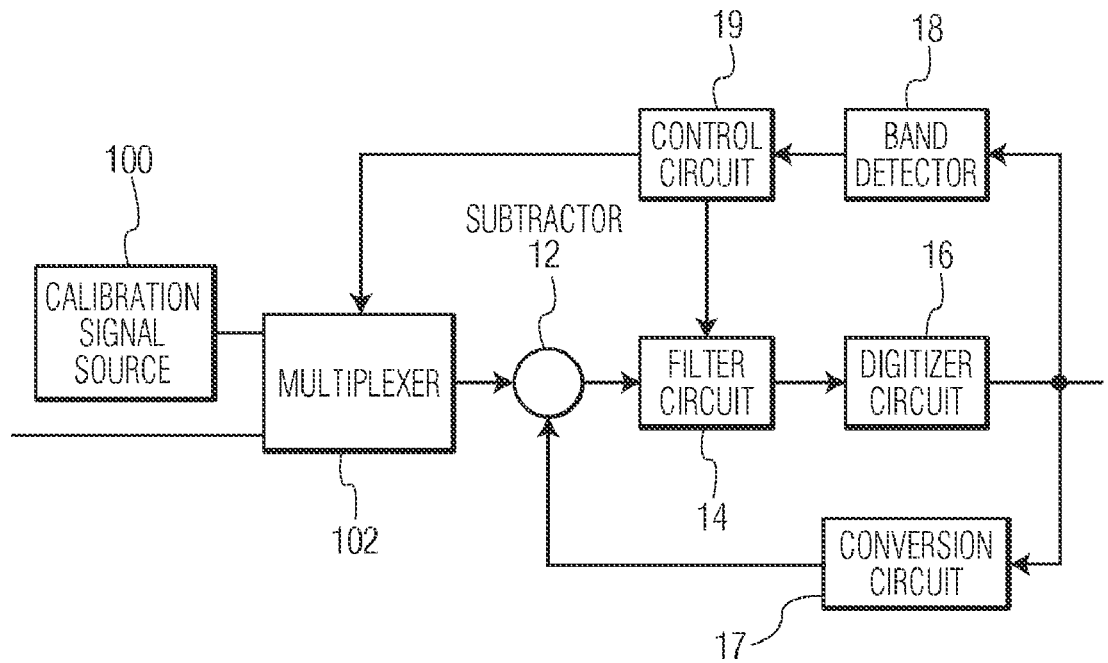
FIGS. 1, 1A show sigma delta analog to digital conversion circuits.

FIG. 1 shows a basic sigma delta A/D converter. It should be realized that the circuit is shown by way of example: the invention is not limited to this particular circuit. The converter comprises an input 10, a subtractor 12, a filter circuit 14, a digitizer circuit 16, a digital to analog conversion circuit 17, a band detector 18 and a control circuit 19. Subtractor 12 has a positive input coupled to input 10 and a negative input coupled to an output of digital to analog conversion circuit 17. An output of subtractor 12 is coupled to an input of digitizer circuit 16 via filter circuit 14. An output of digitizer circuit 16 is coupled to an input of digital to analog conversion circuit 17. Band detector 18 has an input coupled to the output of digitizer circuit 16 and an output coupled to control circuit 19. Control circuit 19 has an output coupled to a control input of filter circuit 14. Filter circuit 14 is for example a simple integrator, but more complex circuit may be used.

Digitizer circuit 16 is for example a one-bit output digitizer circuit. However, a circuit with a higher number of output bits may be used. Digital to analog conversion circuit 17 corresponds to the number of bits produced by digitizer circuit 16. In the case of a one bit digitizer circuit 16, digital to analog conversion circuit 17 can be trivial, doing little more than passing the one bit digital signal after optional amplification or attenuation or optional addition of an offset.

Optionally a calibration signal source 100 and a multiplexer are provided coupled to an input of input 10, and arranged to supply a calibration signal to the input instead of a normal operating signal in a calibration mode.

Figure 1A:
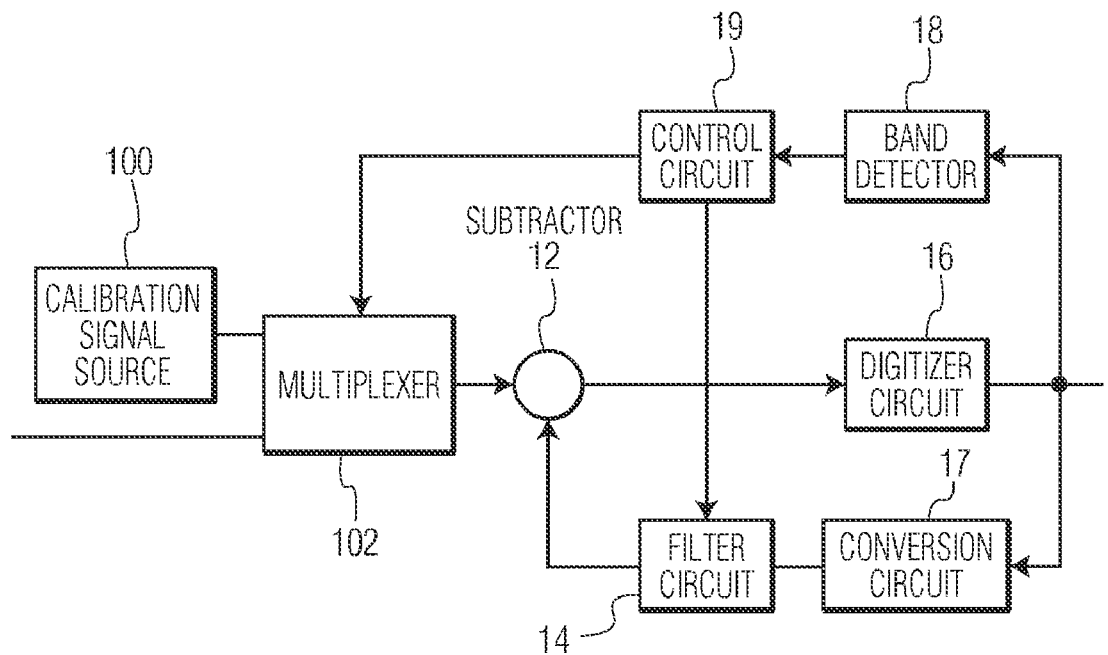

FIG. 1A shows an alternative wherein filter circuit 14 has been incorporated in a feedback path from digital to analog conversion circuit 17 to subtractor 12. Thus, FIGS. 1 and 1A show filter circuits 14 at different possible positions in the feedback loop through filter circuit 14, digitizer circuit 16 and digital to analog conversion circuit 17. As a further alternative filter circuit 14 may be distributed in the loop over the feedback path between digital to analog conversion circuit 17 and subtractor 12 and the feedforward part of the loop between subtractor 12 and digitizer circuit 16.

Figure 2:
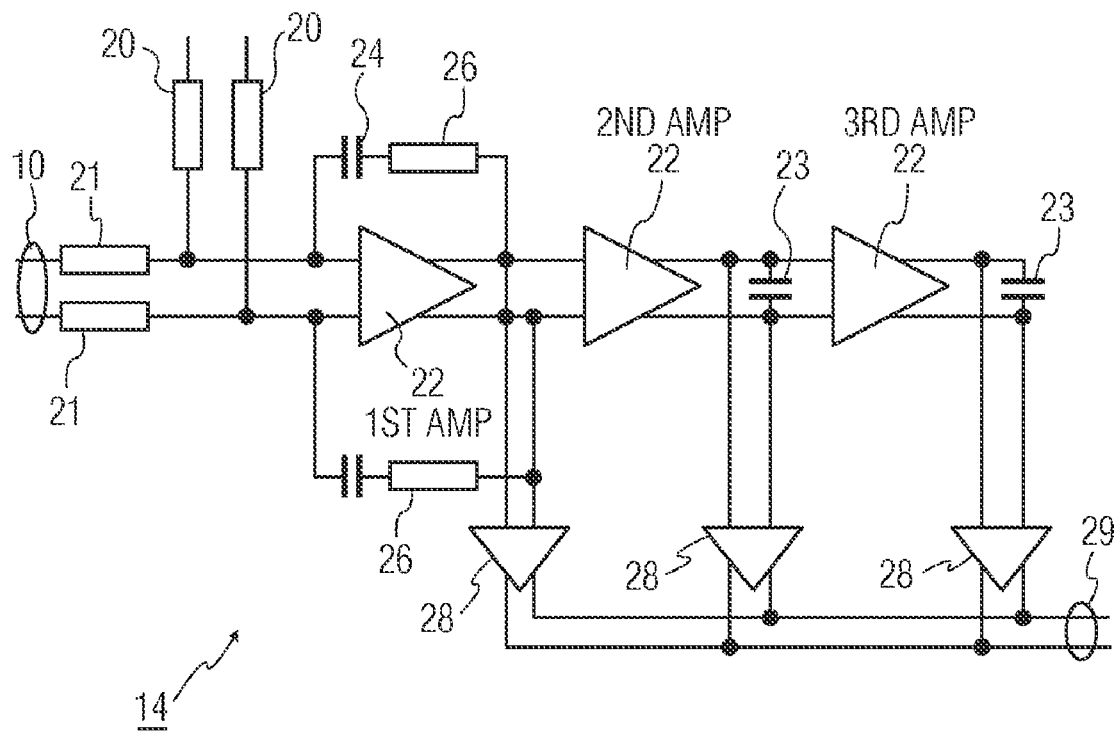
FIG. 2 shows a filter circuit.

FIG. 2 shows an example of a filter circuit 14. It should be emphasized that this example is shown by way of example only: the invention can be applied to any amplifier that contains resistances and capacitors as elements that determine the bandwidth. The filter circuit contains a cascade of three differential amplifiers 22 with differential current source outputs. Input 10 is differential and is coupled to inputs of a first amplifier 22 in the cascade via resistances 21. The feedback output from digital to analog conversion circuit 17 (not shown) is coupled to the inputs of the first amplifier 22 in the cascade via resistances 20. The outputs of the first amplifier 22 are coupled back in a negative feedback via respective series arrangements each of a capacitor 24 and a resistance 26. The outputs of the second and third amplifiers 22 in the cascade are bridged by integrating capacitances 23. The outputs of each of the amplifiers 22 is coupled to the output 29 of the filter circuit via respective differential buffer amplifiers, each with a differential current source amplifier 28.

As has been emphasized, the filter circuit 14 of FIG. 2 is shown merely as an example of a filter circuit 14 wherein a capacitance value (of capacitor 24) and a resistance value (of resistance 26) determines a bandwidth. Preferably controllable capacitors 24 of which the capacitance is controlled by control circuit 19 (not shown). As an alternative, controllable resistances 26 may be used, of which the resistance is controlled by control circuit 19 (not shown). As another alternative one or more amplifiers 22 with a controllable gain (e.g. transconductance, or ratio between input voltage and output current) may be used, of which the gain (transconductance) is controlled by control circuit 19 (not shown), for example comprising transistors arranged as a differential pair whose combined current is controlled by control circuit 19 (not shown). Many different type of filter circuit may be used, each containing a resistance and a capacitor that are at least partly determinative of the filter bandwidth, and wherein the relative parameter values of the resistance and the capacitor are controlled by control circuit 19.

In operation digitizer circuit 16 samples the signals at its input and digitizes (A/D converts) the sampled signals. In an embodiment digitizer circuit 16 uses conversion to one bit digital values, dependent on whether the sampled signal is above or below a threshold. Alternatively, a higher resolution is used, a digital value being derived to indicate in which of three or more ranges the sampled signal lies. The digitized numbers, or numbers derived therefrom are converted back to analog signals in a fixed phase relation to sampling, by digital to analog conversion circuit 17. In the embodiment of FIG. 1A the D/A conversion result is filtered, the filtered signal is subtracted from the input signal and the resulting difference is applied to digitizer circuit. In the embodiment of FIG. 1 the D/A conversion result is subtracted and a filtered version of the resulting difference is applied to digitizer circuit 16.

This form of A/D conversion is known per se. The result of this form of A/D conversion is that digitizer circuit produces signals that are a good representation of input signals in the pass-band of filter circuit 14, even though very course quantization is used, with only a limited number of different digital values for digitizing the samples. The errors that are due to the course quantization (so-called quantization noise) are averaged out over a plurality of samples.

Figure 3:
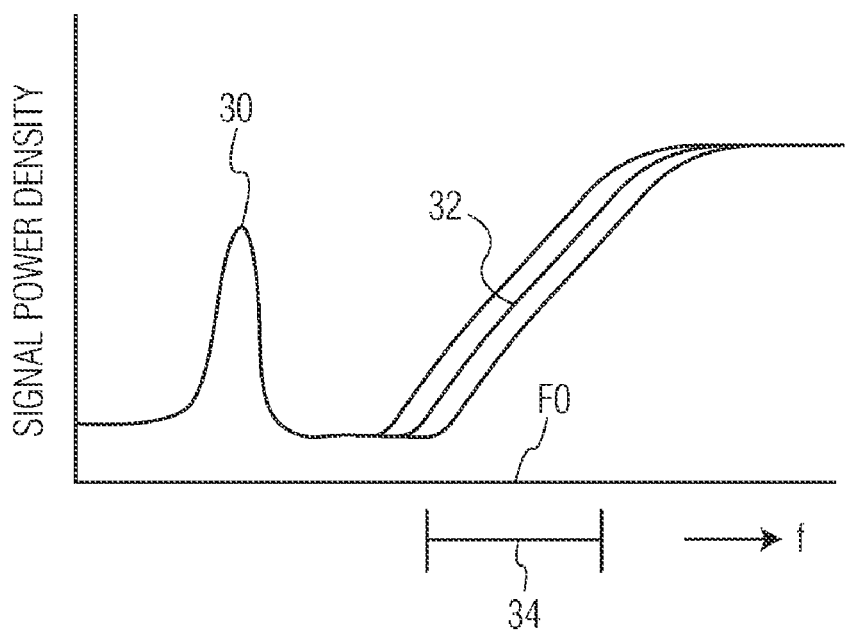
FIG. 3 shows a graph of signal power density.

FIG. 3 shows signal power density at the output of digitizer circuit 16 as a function of frequency. The signal power density contains a peak 30 which is the result of the relevant signal at input 10 and a rising component 32 at higher frequencies, which corresponds to quantization noise.

The figure shows power density logarithmically for three different values of the time constant T of filter circuit 14. The relevant signal component 30 is the same for each value of T. In the case of the circuit of FIG. 1, rising component 32 of the power density of quantization noise is proportional to the square of f*T wherein f is the frequency and T is the integration time constant of filter circuit 14.

Band detector 18 detects the signal strength in a frequency band 34 centered around a frequency F0. Frequency band 34 covers frequencies where the power density exhibits rising component 32 due to quantization noise. If the integration time constant T is raised the power density goes up in this band and if the integration time constant T is lowered the power density goes down. Thus the signal strength in this band (e.g. the average power density, or the average signal amplitude or squared amplitude of the signal part with frequencies in band 34) is indicative of integration time constant T.

Control circuit 19 compares the detected strength with a desired strength and adapts the time constant T of filter circuit 14 so as to minimize a difference with the desired strength. Any type of band detector 18 may be used. Preferably, a digital signal processing circuit is used. As may be noted, the output signal of sigma delta A/D converter (the output of digitizer 16) is a digital signal, which is suitable for such digital signal processing. In one example, band detector 18 comprises a digital frequency bandpass filter followed by a rectifying circuit (absolute value determining circuit) and an averaging circuit to detect the signal strength in the form of an average quantization noise amplitude. As an alternative the rectifier circuit may be replaced by a squaring circuit. Preferably, the detected strength is determined by simulation for the desired time constant T, and the desired strength is set in the circuit to the strength that has been determined by simulation.

In a further embodiment, a band filter circuit that is provided for processing relevant signal 30 is used to adapt the time constant in a calibration mode of operation of the circuit.

Figure 4:
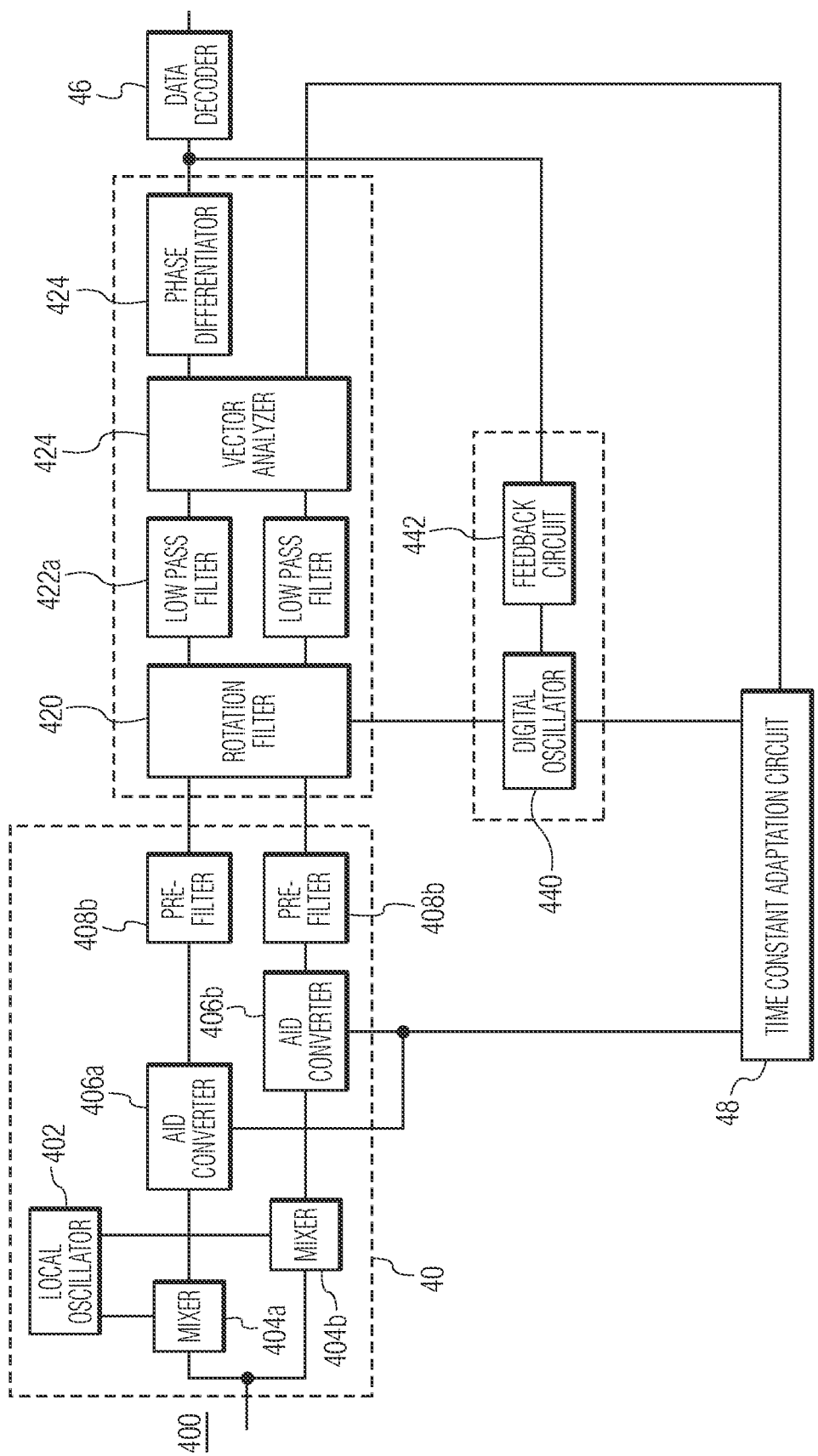
FIG. 4 shows a circuit with a bandpass filter circuit.

FIG. 4 shows a receiver circuit with a bandpass filter. The receiver circuit comprises a preprocessor 40, an IF bandfilter 42, a frequency compensation circuit 44, a data decoder 46 and a time constant adaptation circuit 48. Preprocessor 40 has an input 400, a local oscillator 402, a pair of mixers 404a,b a pair of sigma delta A/D converters 406a,b and pre-filters 408a,b. Mixers 404a,b each have a first input coupled to input 400 and a second inputs coupled to respective quadrature outputs of local oscillator 402. Sigma delta converters 406a,b have inputs coupled to outputs of mixers 404a,b and outputs coupled to pre-filters 408a,b.

IF bandfilter 42 comprises a rotation filter 420, low pass filters 422a,b, a vector analyzer 424, and a phase differentiator 426. Rotation filter 420 has inputs coupled to outputs of pre-filters 408a,b and outputs coupled to vector analyzer 424 through respective ones of low pass filters 422a,b. Vector analyzer 424 has a phase output coupled to phase differentiator 426, which has an output coupled to data decoder 46. Frequency compensation circuit 44 comprises a digital oscillator 440 and a feedback circuit 442 coupled between a control input of digital oscillator.

Time constant adaptation circuit 48 has a control output coupled to digital oscillator 440, for overriding its frequency, an input coupled to an amplitude output of vector analyzer 424 and a control output coupled to sigma delta A/D converters 406a,b.

In operation mixers 404a,b mix down a signal from input 400 and produce quadrature signals. Sigma delta A/D converters 406a,b digitize the quadrature signals, and the digital signals are digitally filtered by pre-filters 408a,b to remove the highest frequencies. Rotation filter 420 digitally rotates the vector defined by the quadrature signal with a frequency of rotation determined by frequency compensation circuit. In this way, the quadrature signals are converted from the IF band to the low frequency band. The converted quadrature signals are digitally low pass filtered by low pass filters 422a,b, which effectively determined the IF bandwidth. Vector analyzer 424 computes the phase and amplitude of the resulting quadrature signals. The phase signal is used to decode data and to control the rotation frequency. Decoded data comprises messages that are processed by further circuits (not shown).

Time constant adaptation circuit 48 switches the circuit between a normal operation mode and a calibration mode. In the normal operation mode frequency compensation circuit 44 controls the rotation frequency, so that it corresponds to that of the signal that is decoded. In the calibration mode time constant adaptation circuit 48 overrides frequency control, so as to switch to frequency a F0 in the middle of frequency band 34. In this way the circuit is made to act as a bandpass filter and amplitude detector in frequency band 34. Time constant adaptation circuit 48 uses the average amplitude output, in the way described hereinbefore, to control the time constant T of sigma-delta A/D converters 406a,b.

Figure 5:
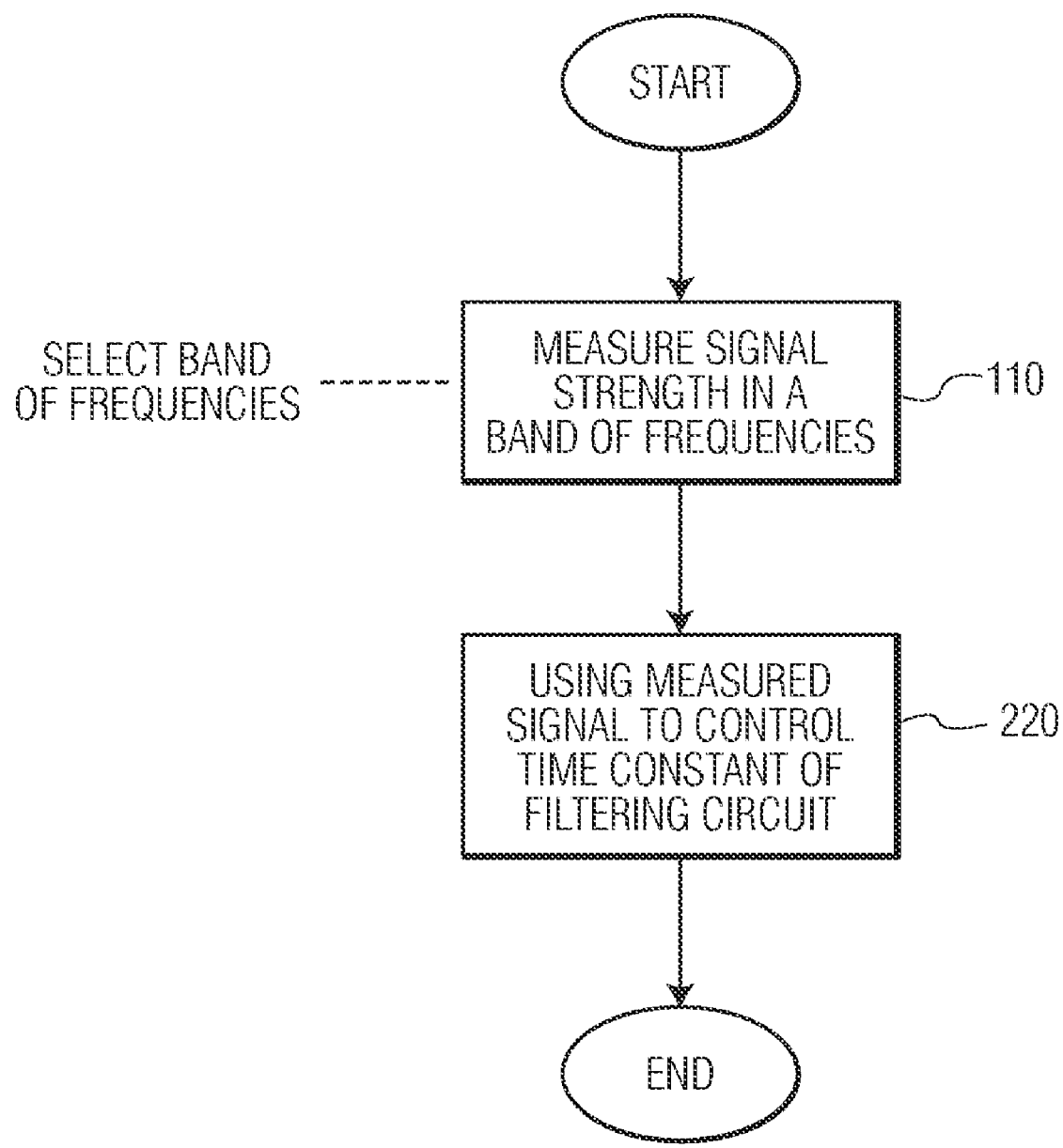
FIG. 5 shows a flow diagram an example method of operating a single processing circuit according an embodiment of the present invention.

In an example embodiment, a method, as shown in FIG. 5, for operating a signal processing circuit may use the circuit depicted in previous FIG. 2. With the example embodiment depicted in FIG. 2, the signal processing circuit that comprises a sigma delta analog to digital converter with a filtering circuit 14 and a controllable time constant is used implements the method. The signal strength is measured 110 in to digital converter. The band of frequencies has been selected so that noise shaped quantization noise density 32 rises with frequency in the band 34 of frequency. The time constant of the filtering circuit 14 (refer back to FIG. 2) is controlled by using the measured signal strength 220.

Various options may be used for switching to the calibration mode. In one embodiment the circuit switches to the calibration mode only after the power is switched on. In an alternative embodiment the circuit switches to the calibration mode regularly, for example in periods when no data reception is in progress, or after controlling that data reception can be temporarily interrupted. Preferably normal signal supply to the sigma-delta A/D converter is suppressed in the calibration mode, and a calibration signal, generated by a calibration signal source 100 (e.g. a pseudo random generator) coupled to the input 10 of the sigma-delta A/D converter, which is preferably included in the integrated circuit, is supplied to the input of the sigma-delta A/D converter, but this is not necessary. Alternatively calibration is executed using the normal operational signal as input.

Although embodiment have been described that use distinct component circuits, it should be realized that different functions of the digital part of the circuit (such as detection, bandpass filtering etc.) may also be implemented using one or more programmable signal processors or a programmable computer. Different ones of the functions may be performed by the same processor under control of different program parts.

Although the invention has been described for a conventional sigma delta A/D converter with an integrating circuit in the feedback loop, it should be understood that the invention can also be applied to other sigma delta A/D converters with more complicated filters in the feedback loop instead of the integrating circuit, e.g. with a band filter, or a low pass filter with a faster fall off with frequency than a simple integrating circuit. This may affect the shape of the noise and the detected signal strength. However, it does not affect the principle that noise shaping occurs, with a rise in quantization noise as a function of frequency occurs in some frequency band, the rise being shifted when the bandwidth of the filtering circuit in the feedback loop of such a sigma-delta A/D converter is changed. Hence, signal strength in such a band may be used to control the bandwidth of the filtering circuit.

The invention claimed is:

1. A signal processing circuit comprising a sigma delta analog to digital converter with a feedback loop that comprises an analog filtering circuit that has a controllable time constant, the signal processing circuit comprising a bandwidth control circuit comprising a detector for detecting a signal strength in a band of frequencies at an output of the sigma delta analog to digital converter, the bandwidth control circuit having an output coupled to a control input of the analog filtering circuit, arranged to control said time constant dependent on the signal strength in a band of frequencies at the output of the sigma delta analog to digital converter, in which band of frequencies noise shaped quantization noise density of the sigma delta analog to digital converter rises with frequency.

2. A signal processing circuit according to claim 1, wherein the analog filtering circuit comprises a capacitance coupled to a time-continuous conductance or transconductance circuit, a ratio, of capacitance and conductance or transconductance values, of the capacitance and the conductance or transconductance circuit respectively, being at least partly determinative of the time constant, the bandwidth control circuit controlling said ratio dependent on said signal strength.

3. A signal processing circuit according to claim 1, wherein the bandwidth control circuit supports switching between a normal operating mode and a calibration mode, the signal processing circuit comprising: a digital band filter with an input coupled to an output of the sigma delta analog to digital converter and arranged to supply band filtered signals in said band of frequencies to the detector in the calibration mode;

a further processing circuit arranged to consume data from the digital band filter in the normal operating mode, the bandwidth control circuit being arranged to control the digital band filter to switch bands from a normal operating band to said band of frequencies when switching to the calibration mode.

4. A signal processing circuit according to claim 3, wherein the digital band filter comprises a rotation generator, a rotation unit arranged to rotate a vector signal at a rate determined by the rotation generator, and a low pass filter arrangement arranged to low pass filter the rotated vector signal, the bandwidth control circuit having a control output coupled to an override input of the rotation generator, to change a rotation rate of the rotation generator to a value corresponding to a frequency in said band of frequencies upon switching to the calibration mode, the detector having an input coupled to an output of the low pass filter arrangement for receiving signals indicative of said signal strength.

5. A signal processing circuit according to claim 3, comprising a calibration signal source, the bandwidth control circuit being arranged to cause signals from the calibration signal source to be applied to the input of the sigma delta analog to digital converter in the calibration mode.

6. A method of operating a signal processing circuit that comprises a sigma delta analog to digital converter with an filtering circuit with a controllable time constant, the method comprising:

measuring signal strength in a band of frequencies at the output of the sigma delta analog to digital converter, wherein the band of frequencies has been selected so that noise shaped quantization noise density rises with frequency in said band of frequencies;

using the measured signal strength to control a time constant of the filtering circuit.

* * * * *